United States Patent [19]

Pomatto

[11] Patent Number: 5,510,700
[45] Date of Patent: Apr. 23, 1996

[54] APPARATUS AND METHOD FOR IDENTIFYING THE PHASE OF A THREE PHASE POWER LINE AT A REMOTE LOCATION

[75] Inventor: Lawrence A. Pomatto, Santa Ana, Calif.

[73] Assignee: Systems Analysis and Integration, Inc., Orange, Calif.

[21] Appl. No.: 136,453

[22] Filed: Oct. 14, 1993

[51] Int. Cl.⁶ .......................... G01R 19/00; G01R 13/02; H04M 1/24; H04M 3/08
[52] U.S. Cl. .......................... 324/66; 324/76.83; 379/25
[58] Field of Search ........................ 324/66, 67, 76.77, 324/76.82, 76.83; 340/658; 379/25, 97, 106

[56] References Cited

U.S. PATENT DOCUMENTS

| | | | |
|---|---|---|---|
| 3,027,513 | 3/1962 | Mulavey et al. | 324/76.83 |
| 4,626,622 | 12/1986 | Bouvrette . | |
| 4,852,174 | 7/1989 | Bouchard . | |

FOREIGN PATENT DOCUMENTS

1270523  6/1990  Canada .

*Primary Examiner*—Walter E. Snow
*Attorney, Agent, or Firm*—Knobbe, Martens, Olson & Bear

[57] ABSTRACT

A phase identification system and method identifies the phase of a power signal at a remote location from a three-phase generator. The system has a radio transmitter which transmits a modulated representation of a voltage signal via radio frequency, and a remote field detector which receives and demodulates the transmitted signal to provide a reference signal. The field detector also includes an input probe for detecting the power signal having an unknown phase at the remote location. The field detector includes a phase comparator and a calibration phase corrector for determining the phase difference between the power signal having a known phase and the power signal having an unknown phase, thereby identifying the phase of the unknown signal at the remote location. The invention also includes a method of calibrating the phase identification system. The method includes the steps of modulating and transmitting a known phase signal, receiving and demodulating the same signal, and comparing the demodulated signal with a signal having the same phase as the known signal to determine the phase difference due to the transmitting and receiving circuitry. This phase difference constitutes the calibration offset value which is subtracted from the measured phase difference between the reference signal and the detected unknown signal to obtain a corrected phase difference value.

8 Claims, 5 Drawing Sheets

APPARATUS AND METHOD FOR IDENTIFYING THE PHASE OF A THREE PHASE POWER LINE AT A REMOTE LOCATION

BACKGROUND OF THE INVENTION

1. Field of the Invention

The present invention relates to phase detectors for high power distribution networks, and more particularly to remote devices which may be used to identify which phase in a three-phase power system is carried by a line.

2. Description of the Related Art

As is well known in the art, conventional high-power distribution networks carry voltages in three phases, generally identified as the A, B and C phases. The three voltage phases typically consist of 50 Hz or 60 Hz sine waves which are out of phase by approximately 120°. The three phases are generated at a power plant or other power source and distributed across a wide service area to provide power to multiple residences and businesses. A three-phase power transmission line generally has three transmission conductors, one for each phase, and sometimes a fourth conductor which is neutral.

Many utility companies experience difficulties which arise from the inability of field personnel to accurately identify the phase of a transmission line on an unmarked cable in an underground vault in an underground system. The inability to identify a given conductor causes operational problems. Specifically, the lack of proper identification of the voltage phase carried by remote voltage conductors causes difficulty when customer loads have to be shifted from one phase to another under emergency conditions, or when a planner is preparing for future load expansion. Both situations require proper load balancing among the three phases along the distribution network to operate the network effectively. In short, reliable phase identification would allow field personnel to perform their functions with increased confidence and effectiveness.

Devices developed to identify the phases of signals carried by unmarked power lines have been cumbersome and often unacceptable with regard to the accuracy of the measurements provided by these devices. For example, one device, disclosed in U.S. Pat. No. 4,626,622, proposes the identification of an unknown phase via a telephone or cellular phone connector to a circuit having a known phase. The known phase of one of the voltage signals is digitized and transmitted over the telephone system. The data is received by a remote unit and reconverted into a reference signal which is representative of the transmitted voltage signal having a known phase. The reference signal is compared with the signal having an unknown phase to determine the phase of the unknown signal.

A number of complications are associated with such systems. Specifically, because a series of different data conversions and transmissions is required to provide a reference signal, and because these conversions and transmissions involve inductive and/or capacitive delays, a significant phase difference exists between the reference signal and the actual known signal from which the reference signal was derived. In the system described in U.S. Pat. No. 4,626,622, a calibration is performed at each remote location to compensate for the phase lag introduced at various remote locations. However, because telephone companies sometimes operate by route switching to increase efficiency, signals on telephone lines are sometimes rerouted over circuits which may vary by hundreds of miles. The additional phase shift introduced by the time delay associated with such rerouting may change after calibration. Thus, present phase identification systems can be unreliable due to the necessity of calibration at each remote location and due to the possible change in delays introduced by telephone line rerouting.

In addition, phase identification systems often digitize the known reference signal. In order to preserve an accurate representation of the known analog sine wave, a high bit resolution, and thereby a high transmission bandwidth, is required. However, a high transmission bandwidth is often not provided by ordinary telephone connections which typically have a bandwidth of 3 KhZ or less. Consequently, any telephone transmission of a digitized reference signal is typically low resolution, or only uses a single "ping" transmitted at every zero crossing. Thus, the reference signal is not transmitted in its entirety. The limited bandwidth compromises the flexibility of such systems.

SUMMARY OF THE INVENTION

The present invention is a phase identification system which detects the phase of a voltage signal on an unmarked voltage line within a power distribution system. The phase identification system utilizes a reference signal as a standard against which to compare the unknown signal. The reference signal is frequency modulated in the audio frequency band and transmitted on a carrier to a remote site where the phase of the unknown signal is to be detected. At the remote site, the reference signal is demodulated with a field detector for comparison to the unknown signal. The transmission of the reference signal to a remote location introduces a substantially constant phase shift into the demodulated reference signal. This constant phase shift is automatically determined and compensated by means of a calibration constant so that the phase of the unknown signal can be accurately determined. Because radio transmission is used, once the system is calibrated, the field detector can be moved throughout a large geographic area without significant differences in phase shift.

One aspect of the present invention involves a phase identification system for determining the phase of a power signal in an unidentified remote conductor coupled to, but remote from, a plurality of power station conductors at a source power station. A plurality of power station conductors carry a plurality of alternating current voltage signals having known phase relationships. The system has a power station transmitter which is coupled to a first conductor of the plurality of power station conductors. The power station transmitter transmits an encoded representation of the power signal carried on the first conductor. The transmitted representation provides a known phase reference signal. A field detector is coupled at a remote location to an unidentified one of the plurality of power station conductors. The field detector has a receiver which receives and decodes the known phase reference signal and a phase comparator. The phase comparator is coupled at the remote location to the unidentified one of the power station conductors and coupled to the receiver. The comparator compares the known phase reference signal to the signal on the unidentified one of the power station conductors to obtain a phase difference between the reference signal and the unknown signal. The system further provides an indicator which identifies the unknown signal. In one embodiment, the plurality of power station conductors are three-phase conductors having known A, B, and C phase relationships. The transmitter preferably comprises a frequency modulator (FM) transmitter which transmits a frequency modulated representation of the selected phase signal. The selected phase signal in turn serves as the known phase reference signal. In the present embodiment, the receiver comprises an FM receiver which receives and demodulates the known phase reference signal.

According to one aspect of the invention, a phase corrector is provided which compensates for phase differences and offsets introduced by the system to provide a corrected phase difference value to identify the unknown phase.

A further aspect of the present invention involves a method of identifying the phase of a power signal at a remote location with respect to the source of the power signal. The method involves transmitting a radio signal which is an encoded representation of a known power signal at the source of the power signal and receiving the radio signal at the remote location. The radio signal is then decoded to provide a reference signal having a determinant phase relationship to the known signal. An unknown power signal at the remote location is then detected and compared with the reference signals to ascertain the phase difference value between the unknown power signal and the reference signal. An indicator is then displayed identifying the phase difference and thereby identifying the unknown power signal. In the preferred embodiment, a calibration offset value is obtained which compensates for phase shifts introduced by the phase detector system. The calibration offset value is used to correct the phase difference such that the unknown phase is accurately identified in comparison to the reference phase. In one embodiment, the encoded representation comprises frequency modulating the known power signal onto a radio frequency carrier. In this embodiment, the radio signal is then demodulated at the remote location to obtain the reference signal having the determinant phase relationship to the power signal having a known phase.

DESCRIPTION OF THE PREFERRED EMBODIMENTS

Figure 1:
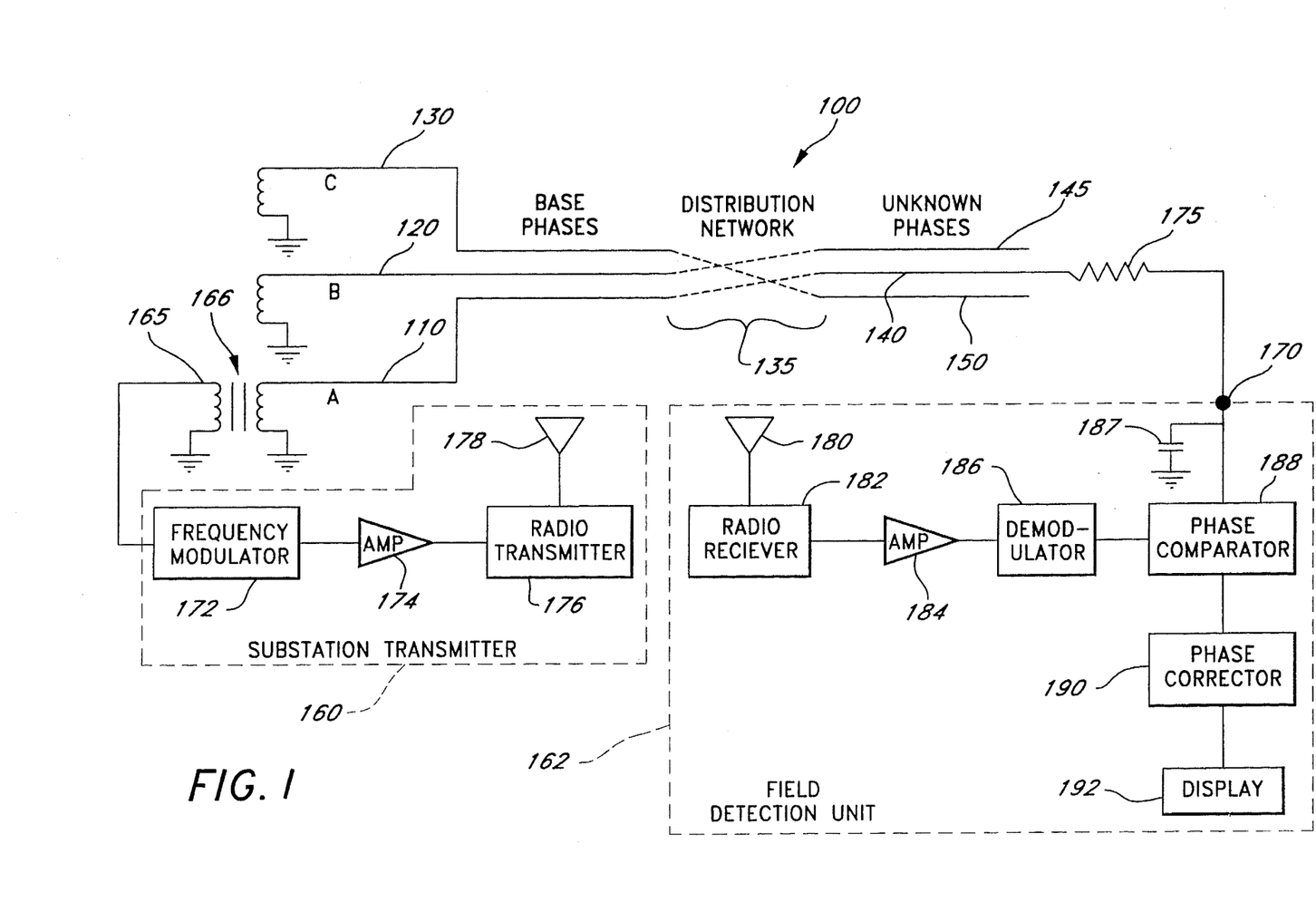
FIG. 1 is a schematic block diagram of the phase identification system of the present invention.

FIG. 1 shows a power distribution network 100 having a power station or substation that generates "A", "B" and "C" phase voltage signals on conductors 110, 120 and 130. The conductors 110, 120, 130 serve as inputs for a power distribution network 135. The voltage signals on the lines 110, 120, 130 are supplied to the power distribution network 135 which distributes power to remote locations. One such remote location is represented by the power conductors 140, 145, and 150.

Overall Configuration of the Phase Identification System

FIG. 1 further depicts a phase identification system comprising a base signal (which is the known signal) substation transmitter 160 and a remote or field detection unit 162. The phase identification system is used to positively identify the phase of the voltage carried on one of the conductors 140, 145, 150 when the phase carried on the conductor is unknown. The line 140 is selected for purposes of this description, and the voltage signal of the A-phase conductor 110 is chosen as the base signal.

The substation transmitter 160 is coupled to the A-phase conductor 110 via a transformer output coil 165. In one embodiment, the transformer 166 has a step-down ratio of 10:1 so that the transformer 166 outputs a 12-volt signal from a 120-volt input. The input of a frequency modulator 172 within the transmitter 160 is coupled to the transformer output coil 165, and the output of the modulator 172 is coupled to an amplifier 174. The amplifier 174 further connects to a radio transmitter 176, having an antenna 178. The frequency modulator 172, the amplifier 174, the radio transmitter 176, and the antenna 178 are all conventional components.

The antenna 178 broadcasts signals to a receiver 182 having an antenna 180. The receiver 182 is coupled to an amplifier 184, which is coupled to a conventional demodulator circuit 186. The demodulator 186 is coupled to one input of a phase comparator 188. A second input of the phase comparator is coupled to the conductor 140 via an elbow connector 170, a resistor 175, and a capacitor 187. An output of the phase comparator 188 is coupled to a phase corrector 190. The phase corrector 190 communicates with a display 192. The antenna 180, the receiver 182, the amplifier 184, the demodulator 186, and the display 192 are all conventional components. As indicated in FIG. 1, the frequency modulator 172, the amplifier 174, the transmitter 176, and the antenna 178 are all contained within the substation transmitter 160. The antenna 180, the receiver 182, the amplifier 184, the phase comparator 188, the phase corrector 190, and the display 192 are all contained within the field detection unit 162.

It should be noted that the schematic representation of the main functional elements of the phase identification system shown in FIG. 1 is a simplified block diagram, and does not depict buffers, filters, and the like which are conventionally included within a transmission/reception system and which are readily understood by one of ordinary skill in the art.

Operation of the Phase Identification System

The general operation of the phase identification system 100 is described below. The first output transformer coil 165 detects the voltage on the conductor 110 and outputs a voltage of the same phase as the voltage on the conductor 110 to the substation transmitter unit 160. The voltage on the conductor 110 is a base signal 203 (FIG. 2B) which is of a known phase.

Figure 2A:
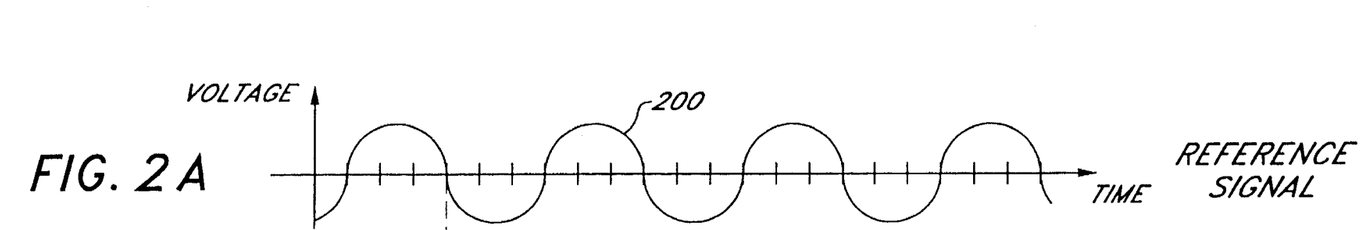
FIGS. 2A–2D are representative of voltage waveforms corresponding to the base or known signal, the reference signal, the calibration signal, and the three possible signals from the three possible phases of the unknown signal at a phase identification test site.
Figure 2B:
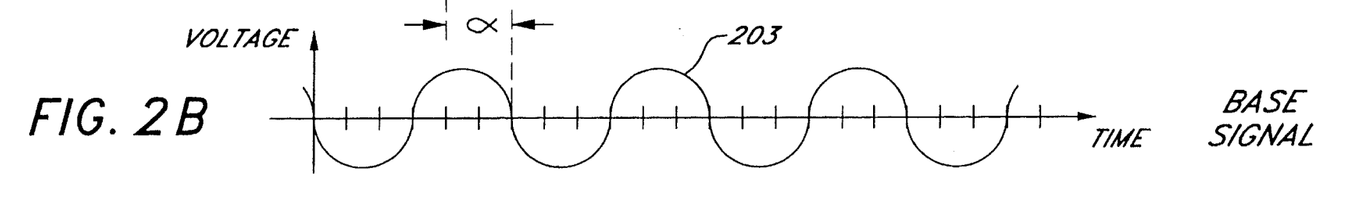

In principle, during operation of the phase identification system, the base signal 203 from the line 110 (stepped down via the transformer 166) is frequency modulated and broadcast over a wide service area using voice radio technology. Personnel in the field receive this signal by means of the field detection unit 162. The detection unit 162 demodulates the broadcast signal to provide a reference signal 200 (FIG. 2A). Although the reference signal 200 is representative of the base signal 203 on the line 110, the reference signal 200 typically has some phase delay, α, relative to the base signal 203. This phase delay is the result of capacitive and inductive components within the transmitter 160 and the detection unit 162. Because the reference signal 200 is phase delayed relative to the base signal 203, a calibration procedure is used to accurately determine the phase of an unknown signal on one of the lines 140, 145, 150. This calibration procedure is described in greater detail with reference to FIGS. 2–4 below. Assuming a calibration correction has been performed, the detection unit 162 compares the demodulated broadcast signal (i.e., the reference signal 200) with an unknown signal on an unidentified conductor at a remote location within the service area. The phase difference between the reference signal 200 and the unknown voltage signal is then used as an indication of the phase class (i.e., A, B, or C) of the unknown signal. A more detailed description of the operation is provided below.

The frequency modulator 172 within the substation transmitter 160 receives the base signal 203 (FIG. 2B), detected from the line 110 by the first output transformer coil 165, and frequency modulates the base signal. In one embodiment, the base signal is frequency modulated from 200 hZ to 2,200 hZ (i.e., the lowest voltage (maximum negative voltage) level is encoded as 200 hZ, while the peak voltage level is encoded as 2,200 hZ). The frequency modulated (FM) signal is then passed through a filter (not shown) having a roll-off frequency of 2,500 hZ, for example. The modulated signal is amplified through the amplifier 174 and applied to the input of the radio transmitter circuit 176. The radio transmitter circuit 176 further broadcasts the frequency encoded signal on a carrier frequency in the radio band (e.g., 120 MHz) via the antenna 178.

The radio transmitter broadcasts the FM radio signal representation of the base signal 203 to the remote field detection unit 162. The antenna 180 within the field detection unit 162 receives the FM signal and directs the signal to the FM radio receiver 182 which is tuned to the carrier frequency of the FM signal transmitted by the substation transmitter 160. The amplifier 184 amplifies the received signal and the demodulator 186 reconstructs the signal by demodulating the amplified FM signal. The recovered signal is then passed through a filter (not shown) having a roll-off frequency of 80 hZ (for a 60 hZ sine wave power system), for example, to smooth out the demodulated signal. The demodulated signal is, therefore, representative of the signal present on the conductor 110 (the base signal 203). The demodulated signal is used as the reference signal 200, which is input to the phase comparator 188.

The phase comparator 188 compares the reference signal 200 with an unknown signal, which could be the signal 210, 220 or 230 (FIG. 2C), on the conductor 140. The unknown signal 210, 220, or 230 is applied to the input of the phase comparator 188 via the elbow connector 170. The amplitude voltage of the signal applied to the input of the phase comparator 188 depends upon the values of the resistor 175 and the capacitor 189. Specifically, the resistor 175 and the capacitor 189 form a voltage divider circuit wherein the voltage applied to the input of the comparator 188 is taken across the capacitor 189 within the detection unit 162. As is well known in the art, the reactance, or effective resistance, of the capacitor 189 is inversely proportional to the frequency and the capacitance of the capacitor 189. Thus, assuming a constant frequency of 60 hZ, an effective resistance of the capacitor 189 may be calculated to provide the desired input voltage to the phase comparator 188. In one embodiment, the resistance of the resistor 175 is approximately 100 megohms, while the capacitance of the capacitor 189 is approximately 0.01 microfarad. Furthermore, the voltage level at the test point is typically in the range of 4,000 volts to 16,000 volts.

It should be observed here that the capacitor 189 will introduce a phase shift of approximately 90°. However, because the capacitor 189 is implemented within the detection unit 162, the same phase shift will be introduced for all measurements, regardless of the remote location within the service area. Therefore, the phase shift introduced by the capacitor 189 will be calibrated for all phase determinations. Thus, the capacitor 189 does not significantly degrade the accuracy of the phase classifications determined in accordance with the present invention.

The phase comparator 188 measures the phase difference between the reference signal 200 and the unknown signal 210, 220, 230. This phase difference allows field personnel to positively identify the phase class of the unknown signal as the A-, B- or C-phase. The method of identifying the phase of the unknown signal 210, 220, 230 will be described in greater detail below with reference to FIG. 5.

Once the phase difference between the reference signal 200 and the unknown signal 210, 220, or 230 has been determined, a calibration offset value is added to the measured difference by a phase corrector 190. When the calibration offset value has been added to the measured phase difference between the unknown signal and the reference signal 200, the resulting value will represent the difference between the phase of the base signal 203 and the phase of the unknown signal 210, 220 or 230. Once the phase difference between the base signal 203 and the unknown signal 210, 220 or 230 has been determined by adding the appropriate calibration offset value, the phase difference is displayed on a display panel 192. The field operator is able to use the value indicated by the display 192 to accurately determine and identify the phase of the voltage signal carried by the line 140. Alternatively, the display panel 92 display indicates the proper phase.

Specifically, if the phase difference indicated on the display 190 is approximately zero (i.e., when the unknown signal corresponds to the signal 210), then the line 140 is identified as carrying an A-phase voltage since the signal on the line 140 is detected as in phase with the base signal 203. However, if the phase difference is approximately +120° (i.e., when the unknown signal corresponds to the signal 230), then the signal on the line 140 will be identified as a B-phase voltage. Finally, if the signal on the line 140 is +240° out of phase with the base signal 203 (i.e., when the unknown signal corresponds to the signal 220), then the signal on the line 140 will be identified as a C-phase voltage.

Figure 3:
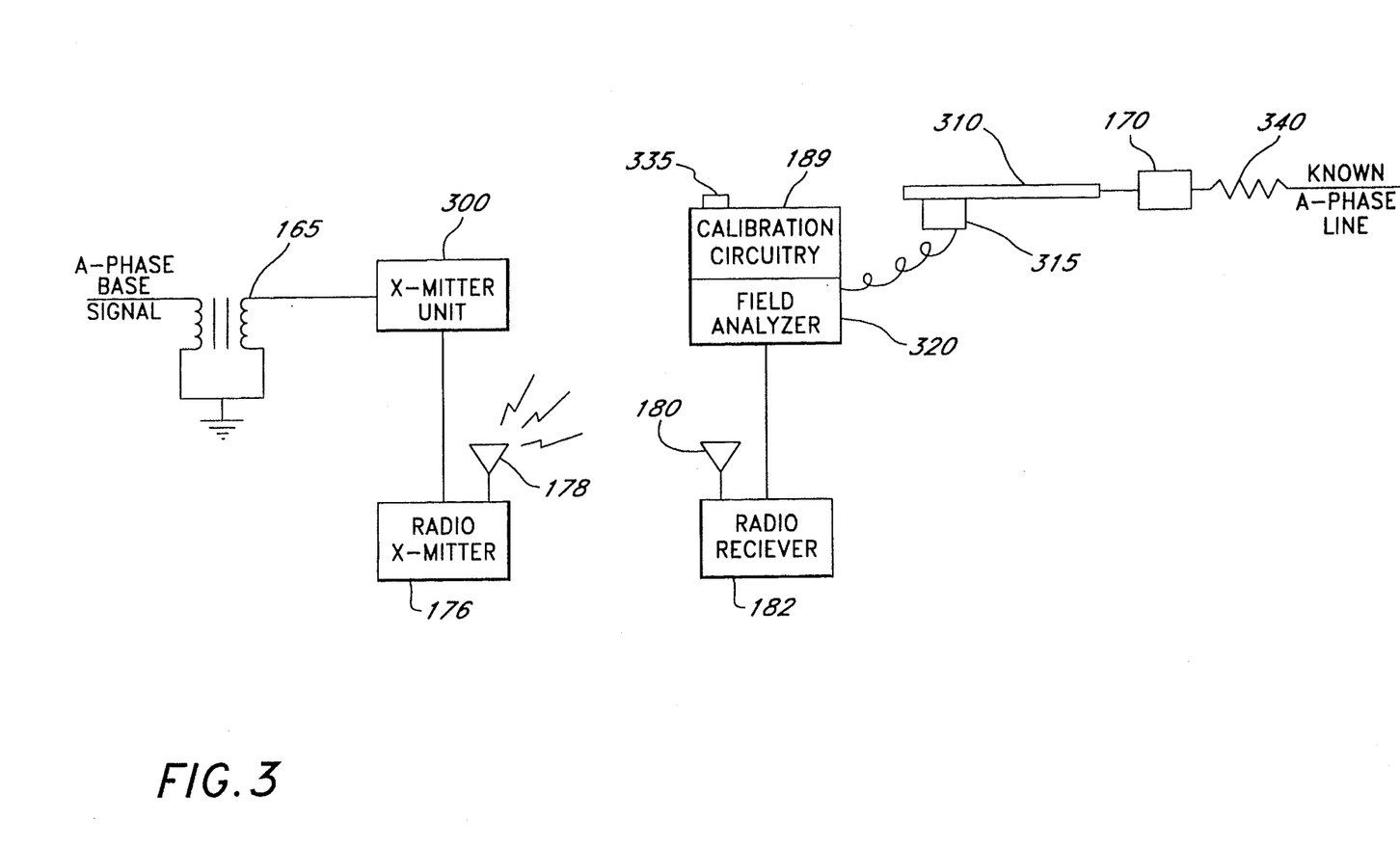
FIG. 3 is a schematic block diagram depicting the structural elements of the phase identification system used during calibration.

The phase shifts introduced by the testing circuitry are accounted for with a calibration offset value, which is determined during the calibration procedure outlined in FIG. 4 and described with reference to FIG. 3. FIG. 3 is a schematic block diagram which shows the main structural elements of the substation transmitter 160 and the field detection unit 162 as connected during calibration. The substation transmitter 160 comprises two main structural elements: a transmitter unit 300 (including the frequency modulator 172 and the amplifier 174), and the radio transmitter 176 with the antenna 178. The receiving portion of the system comprises several main structural elements: a probe 310 with an optical-electrical convertor 315, a field analyzer 320 (which is the field detection unit 162 from FIG. 1, including the amplifier 184, the demodulator 186, the phase comparator 188, the phase corrector 190, and the display 192, with the radio receiver 182 separated), and the radio receiver 182 with the antenna 180. The receiving portion of the system also has the calibration circuitry 189 with a calibration button 335.

Figure 2C:
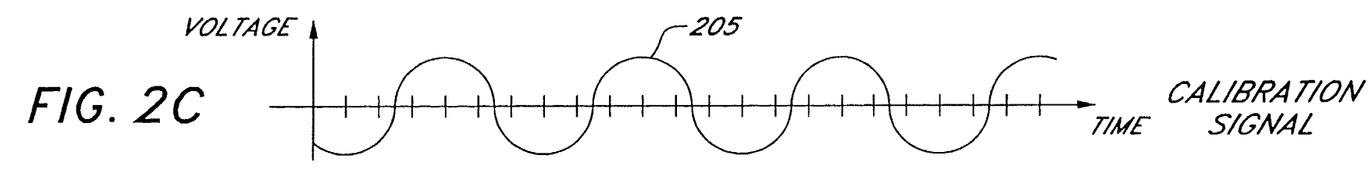
Figure 2D:
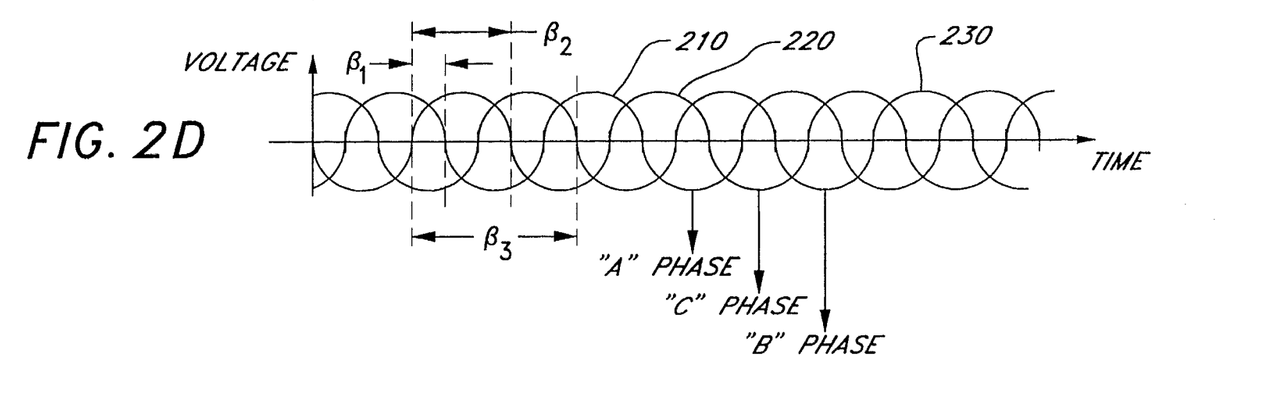

During the calibration procedure, a field operator connects the probe 310 to a conductor with a voltage signal of a known phase to provide a calibration signal 205 (FIG. 2C). The probe is connected to the same phase conductor as the transmitter 300 (e.g., the A-phase conductor). Due to the 90° phase shift introduced by the capacitor 189 (not shown in FIG. 3), the calibration signal 205 (which is a signal applied to the input of the phase comparator 188 internal to the field analyzer 320) is shifted by approximately 90° from the A-phase signal 210, as shown in FIGS. 2C and 2D. It should be noted that it is not necessary to use the A-phase voltage as opposed to the B- or C-phase voltages to provide the calibration signal 205. In practice, any one of the A-, B- or C-phase voltage signals may be used as the known signal, as will be understood by one of ordinary skill in the art. The calibration signal 205 serves as the standard to provide the calibration constant for all measurements. During the calibration procedure, the calibration offset value is determined within calibration circuitry 189. The calibration offset value is essentially a value which represents the phase difference between the reference signal 200 and the calibration signal 205. In practice, the calibration constant is selected such that the calibration signal 205 and reference signal 200 have no apparent phase difference. Thus, the calibration offset value allows the field analyzer 320 to accurately determine the phase difference between an unknown signal on one of the lines 140, 145, 150 and the known phase of the base signal 203. This calibration procedure will be described in greater detail below.

Figure 4:
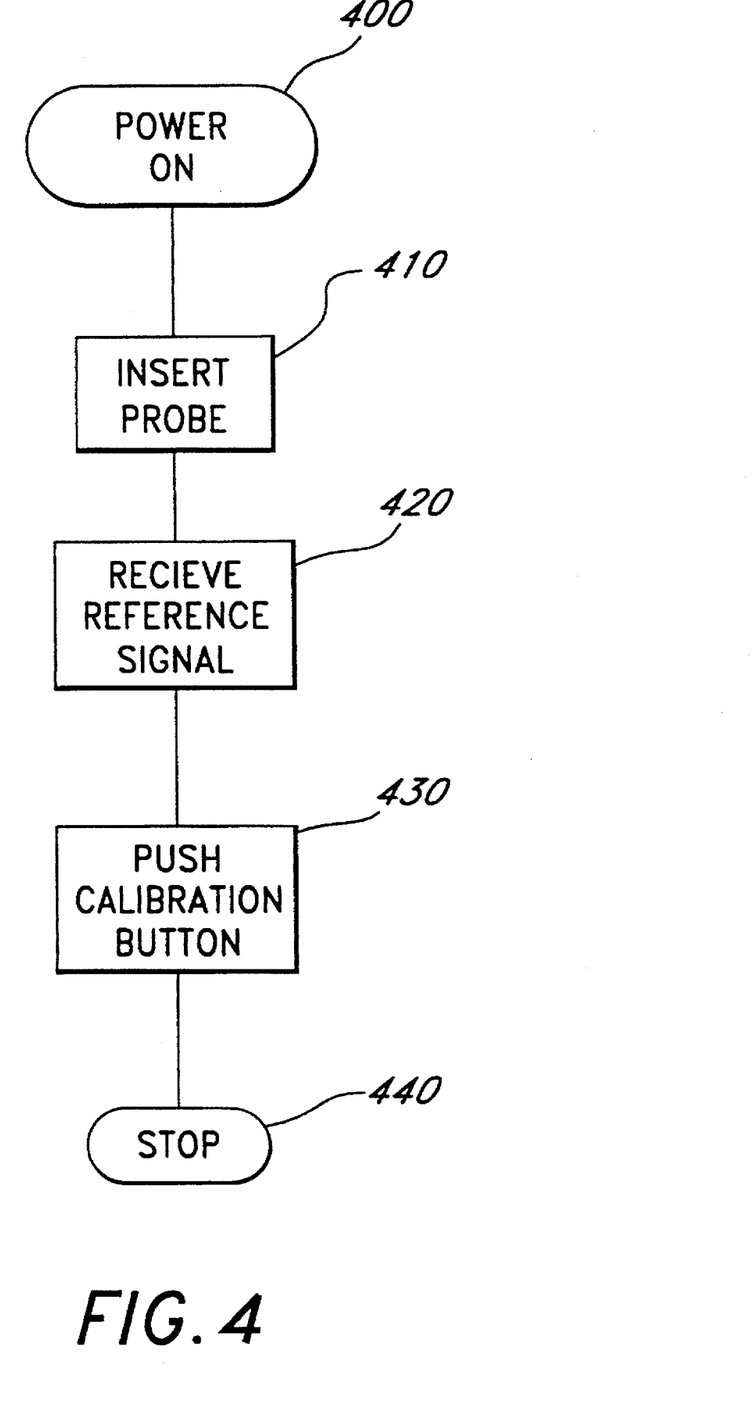
FIG. 4 is a flowchart representing the general method used to calibrate the field detection unit.

As represented in FIG. 4, the calibration procedure begins in a "POWER ON" block 400 wherein the calibrating technician activates the field analyzer 320. Next, the calibration technician inserts the probe 310 into the elbow connector 170 as represented by the activity block 410. As shown in FIG. 3, the elbow connector 170 connects immediately to the output of a resistor 340. The signal is converted into an optical signal at the elbow connector 170. This is done to prevent injury to the technician due to the high voltage levels (e.g., 12,000 volts) at the connector 170. The electrical-to-optical conversion involves first converting the 60 hZ voltage signal at the connector 170 into a frequency modulated signal by means of a voltage to frequency convertor (not shown). Such frequency convertors are typically known as asynchronous voltage-to-frequency convertors, available from National Semiconductor, Texas instruments, and Burr Brown, as well known in the art. The frequency modulated signal is then pulsed and converted to an optical signal via a laser diode configuration (also not shown). The pulsed optical signal then propagates along a fiber-optic line within the probe 310. The convertor 315 then converts the optical signal into an electrical signal and reconstructs a 60 hZ voltage signal which is a scaled version of the voltage signal present at the connector 170. Finally, the convertor 315 transmits this signal to the field analyzer 320. It should be understood that the process of electro-optical coupling introduces some phase shift on the order of 15° to 50°. However, because this phase shift is dependent on the characteristics of the probe 310, the connector 170, and the convertor 315, the phase shift remains substantially constant over time, and the calibration accounts for this phase shift.

The signal provided by the convertor 315 corresponds to the calibration signal 205. The calibration technician then requests transmission of the base signal 203 so that the reference signal 200 is received within the field analyzer 320, as represented in the activity block 420. It should be noted that in a preferred embodiment, the substation transmitter 160 transmits the base signal 203 only upon request, although continuous transmission of the base signal 203 may be preferable in certain cases so that it is not necessary for a field operator to request transmission at each test site. Once the reference signal 200 is received by the field analyzer 320, the phase difference between the calibration signal 205, and the reference signal 200 (received by the receiver 182) is measured by the phase comparator 188, and displayed on the display 192 (FIG. 1). This displayed value is the calibration offset value.

It should be noted that because the radio transmission of a signal within a range of a few hundred miles introduces a negligible phase shift for the purpose of measuring the phase of a 60 Hz signal, the only significant phase shift between the base signal 203 and the reference signal 200 is introduced by the transmission and receiving circuitry. Thus, because this circuitry introduces essentially the same phase shift each time a measurement is taken, the phase difference between the base signal 203 and the calibration signal 205 is essentially constant. Thus, the calibration offset value remains essentially constant and does not vary significantly with the distance between the transmitting power source and the remote location. As a consequence, the field operator at the remote location need not calibrate the field detection unit 162. This is a significant advantage over prior devices which may require calibration at each measurement.

Because the difference between the base signal 203 and the calibration signal 205 is included within the calibration offset value, it is necessary to keep the same phase of the base signal 203 throughout the transmission. If for some reason the base signal 203 must be changed, the field operator would be required to recalibrate with reference to the new base signal 203. Furthermore, due to circuit decay, or slight phase shift changes due to replaced or modified transmission or reception circuitry, it may be desirable to calibrate the field detection unit 162 once a month or so.

To record the calibration offset, the calibration technician (for example, the field operator) pushes the calibration button 335 on the field analyzer 320, as represented in the activity block 430. With the calibration now complete, the calibration technician deactivates the receiving portion 320, as represented in the "POWER OFF" block 440.

The calibration offset may be recorded in a variety of ways. In one embodiment, for example, the calibration value is stored in a non-volatile memory in the field analyzer 320. One method to determine the calibration offset is for the reference signal 200 and the known calibration signal 205 to be converted to square waves of the same frequency having easily detectable rising and falling edges. A reference clock is then established using a high frequency crystal oscillator having a frequency which is a multiple of 60×3,600 hZ, so that 3,600 counts may be performed in one cycle of the reference or calibration signals 200, 205. The clock is initiated at the rising edge of the reference signal 200, and is terminated at the rising edge of the calibration signal 205. The number of counts detected between the rising edge of the reference signal 200 and the rising edge of the calibration signal 205 will be a value between 0 and 3599 which corresponds to a phase difference of 0° to 359.9°. The count value is stored within a 12-bit shift register memory (not shown) when the calibration button 335 is pressed for use as the calibration offset value.

One skilled in the art will appreciate that many ways exist to carry out the phase comparison described above. For example, the reference signal 200 and the calibration signal 205 could be normalized to the same peak-to-peak voltage. An arcsine table memory may then be used to determine an angular value corresponding to the voltages of both signals simultaneously. The angular values are then subtracted to obtain a phase difference value which serves as the calibration offset value. Thus, the calibration offset value may be determined in a variety of ways according to the needs of the particular system.

Figure 5:
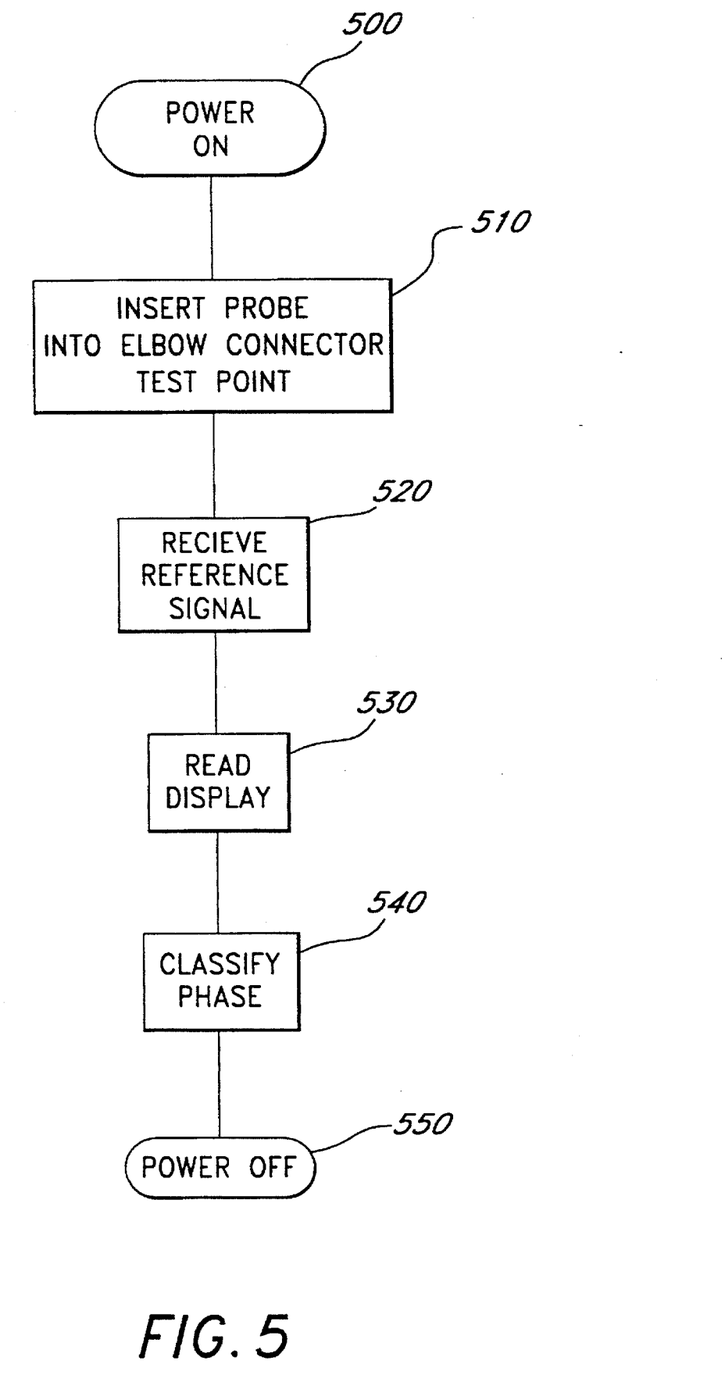
FIG. 5 is a flowchart representing the method used to identify the phase of an unknown voltage signal at a field test point.

Once the calibration offset value is stored, the field test personnel can detect the phase of any unmarked power lines originating from the source power station in accordance with the flowchart of FIG. 5. First the field tester powers up the field detection unit 162 as represented in the block 500, and subsequently inserts the probe 310 into an elbow connector at the remote test site, as represented in the activity block 510. The field detection unit 162 therefore receives the unknown signal 210, 220, or 230 at the remote test site via the elbow connector and the probe 310. The tester then initiates reception of the frequency modulated reference signal 200 as indicated in the activity block 520.

As noted above, several significant advantages accrue due to the manner in which the reference signal 200 is transmitted to the remote test site. Most notably, the high bandwidth provided by the FM radio signal transmission instead of telephone or other communications media, allows the reference signal 200 to be transmitted whole and complete to the field detection unit 162. This advantage provides increased system flexibility and allows for the calculation of Watts, VARS and power factor. In addition other calculations based upon wave morphology may be accomplished with greater efficiency and accuracy, either by means of a real-time, continuous calculation, or by storing the waveshape in memory and processing information at a later time.

Once the field detection unit 162 has received the reference signal 200, the field detection unit 162 internally compares the unknown signal 210, 220, or 230 to the reference signal 200. The phase comparison between the reference signal 200 and the unknown test signal 210, 220, or 230 is carried out in substantially the same manner as the phase comparison performed between the reference signal 200 and the calibration signal 205 described above. The phase difference between the unknown signal and the reference signal 200 is then calculated and stored as a digital value. The phase corrector 190 subsequently adds the calibration offset value to the newly determined phase difference and displays the resulting value on the display 192. This displayed value is representative of the phase difference between the phase of the unknown signal and the known phase of the base signal 203. The field tester then reads the display as represented in the activity block 530.

The tester then classifies the phase as A, B, or C phase (0°=A, 120°=C, and 240°=B) as indicated in the activity block 540. Finally, the field detector power is turned off as represented in block 550. In one embodiment of the present invention, the accuracy of the displayed phase difference ranges from plus or minus 3°–4° (about a 1% error). However, with this method, an error tolerance of 20%–30% is acceptable because phases are separated by 120°.

The entire field detection unit 162, as constructed in accordance with the teachings of the present invention, is compact and portable (e.g., 10"×10"×14", and about 10 pounds in one embodiment). Furthermore, the system requires less than a minute of operation time to identify the phase on an unknown line. The present invention provides an easy and economic means of identifying the phases of a number of power lines at a plurality of remote locations.

The present invention may be embodied in many specific forms which do not depart from the essential spirit and scope of the invention. For example, amplitude modulation, rather than frequency modulation could be used in some particular applications. Furthermore, other analog methods could be used to indicate the phase difference between the reference signal 205 and the unknown signal. Therefore, the above description should be understood as simply illustrative and not restrictive. Accordingly, the extent and essence of the present invention is defined by the following claims.

What is claimed is:

1. A phase identification system for determining the phase of a power signal in an unidentified remote conductor coupled to, but remote from a plurality of power station conductors at a source power station, the plurality of power station conductors carrying a plurality of alternating current voltage signals having known phase relationships, said system comprising:

a power station transmitter coupled to a first conductor of said plurality of power station conductors, such that said transmitter receives one of said alternating signals carried on said first conductor and transmits said alternating signal as known phase reference signal; and a field detector coupled at a remote location to an unidentified one of said power station conductors, said field detector comprising:

a receiver which receives and decodes the known phase reference signal;

a phase comparator coupled at a remote location to an unidentified one of said plurality of power station conductors and coupled to said receiver, wherein said comparator compares said reference signal to an unknown signal on said unidentified one of said plurality of power station conductors to obtain a phase difference between said reference signal and said unknown signal;

a phase corrector coupled to said phase comparator, said phase corrector responsive to a calibration request to ascertain a phase correction value to compensate for phase shift introduced by the power station transmitter and the field detector; and an indicator which identifies said unknown signal.

2. The phase identification system of claim 1, wherein the signals on said power station conductors are three-phase, 60 Hz power signals having known A, B, and C phase relationships, and wherein said transmitter comprises a frequency modulator (FM) transmitter which transmits one of the A, B, or C phase signals by frequency modulating said A, B, or C phase signal, and wherein said transmitted signal serves as the known phase reference signal.

3. The phase identification system of claim 2, said receiver comprising an FM receiver which receives and demodulates said reference signal, and wherein said unidentified one of said power station conductors is either said A, B, or C phase signal.

4. A field detector for identifying the phase of a power signal at a remote field location in a power distribution network having a plurality of conductors carrying voltage signals with predetermined phase relationships, wherein said power signal is originally generated at a source station, said detector comprising:

a probe which detects a remote voltage signal with an unknown phase at said remote field location;

a radio signal receiver configured to receive a radio signal comprising a frequency modulated voltage signal of a known phase transmitted from said source station;

a demodulator which demodulates said radio signal to reconstruct at least a portion of said known power signal to provide a reference signal, a phase comparator which compares the phase of said reference signal with the phase of said remote voltage signal to provide a phase difference value; and calibration circuitry which determines and stores a calibration offset value, and a phase corrector which corrects said phase difference by including said calibration offset value with said phase difference value.

5. A method of identifying the phase of a power signal at a remote location with respect to the source of said power signal, said method comprising the steps of:

transmitting a radio signal which is a frequency modulated known power signal from the source of said power signal;

receiving said radio signal at a remote location demodulating said radio signal to reconstruct at least a portion of said known power signal to provide a reference signal having a determinate phase relationship to said known signal;

detecting an unknown power signal at said remote location;

comparing the phase of said reference signal with the phase of said unknown power signal to obtain a phase difference value;

obtaining a calibration offset value that compensates for phase shifts;

correcting said phase difference value in accordance with said calibration offset value; and displaying an indicator based upon said phase difference.

6. The method of identifying the phase of a power signal at a remote location with respect to the source of said power signal, said method comprising the steps of:

transmitting a radio signal which is a frequency modulated known power signal from the source of said power signal;

receiving said radio signal at a remote location;

demodulating said radio signal to reconstruct at least a portion of said known power signal to provide a reference signal having a determinate phase relationship to said known signal;

detecting an unknown power signal at said remote location;

comparing the phase of said reference signal with the phase of said unknown power signal to obtain a phase difference value;

obtaining a calibration offset value that compensates for phase shifts;

correcting said phase difference value in accordance with said calibration offset value by applying said calibration offset value to said difference value, said calibration value compensating for phase shifts introduced during the method; and displaying an indicator based upon said phase difference value.

7. A method of identifying the phase of a power signal at a remote location with respect to the source of said power signal, said method comprising the steps of:

transmitting a radio signal in the form of a frequency modulated representation of said power signal at said source of said power signal;

receiving said frequency modulated radio signal at a location at or remote from said source;

detecting a power signal of known phase at said source or remote from said source;

determining a calibration value based upon a phase difference between said received radio signal and said modulated representation of said power signal;

receiving said second radio signal at a remote location;

demodulating said radio signal to reconstruct at least a portion of said known power signal to provide a reference signal having a determinate phase relationship to said known signal;

detecting an unknown power signal at said remote location;

comparing the phase of said reference signal with the phase of said unknown power signal to obtain a phase difference value; and applying said calibration value to said phase difference value, said calibration value compensating for phase shifts introduced during the method.

8. A phase identification system for determining the phase of a power signal in an unidentified remote conductor coupled to, but remote from a plurality of power station conductors at a source power station, the plurality of power station conductors carrying a plurality of alternating current voltage signals having known phase relationship, said system comprising:

a power station transmitter coupled to a first conductor of said plurality of power station conductors, said transmitter transmitting a radio signal encoded representation of a power signal on said first conductor, wherein said transmitted representation provides a known phase reference signal; and a field detector coupled at a remote location to an unidentified one of said power station conductors, said field detector comprising:

a receiver which receives and decodes the known phase reference signal;

a phase comparator coupled at a remote location to an unidentified one of said plurality of power station conductors and coupled to said receiver, wherein said comparator compares said reference signal to an unknown signal on said unidentified one of said plurality of power station conductors to obtain a phase difference value between said reference signal and said unknown signal;

a phase corrector which stores a calibration value and adds said calibration value to said phase difference value to obtain a corrected phase value; and an indicator which identifies the phase of said unknown signal based upon said corrected phase value.

* * * * *

UNITED STATES PATENT AND TRADEMARK OFFICE
CERTIFICATE OF CORRECTION

PATENT NO. : 5,510,700
DATED : April 23, 1996
INVENTOR(S) : Pomatto

It is certified that error appears in the above-indentified patent and that said Letters Patent is hereby corrected as shown below:

```
Column 10, line 23, change "signal as known" to --signal as a
known--.
Column 11, line 14, change "location" to --location;--.
Column 12, line 32, change "phase relationship" to --phase
relationships--.
```

Signed and Sealed this

Tenth Day of June, 1997

Attest:

BRUCE LEHMAN

Attesting Officer   Commissioner of Patents and Trademarks